(12) United States Patent
Watanabe et al.

(10) Patent No.: US 7,508,077 B2
(45) Date of Patent: Mar. 24, 2009

(54) SEMICONDUCTOR DEVICE AND METHOD OF MANUFACTURING SAME

(75) Inventors: Mitsuru Watanabe, Hyogo (JP); Tetsuya Fukui, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 454 days.

(21) Appl. No.: 11/171,282

(22) Filed: Jul. 1, 2005

(65) Prior Publication Data

US 2006/0006506 A1 Jan. 12, 2006

(30) Foreign Application Priority Data

Jul. 9, 2004 (JP) ............................. 2004-202989

(51) Int. Cl.
*H01L 23/52* (2006.01)
*H01L 23/48* (2006.01)
*H01L 29/40* (2006.01)

(52) U.S. Cl. .............................. 257/763; 257/E23.062; 257/666; 257/99; 257/177; 361/813; 361/820; 174/260; 338/22 R

(58) Field of Classification Search .......... 257/E33.006, 257/E33.063, E33.066, 98–100, 91, 676, 257/666, 778, E29.148, E29.165, E23.062, 257/E23.044, 766, 668–670, 761–763, 772, 257/177, 178, 584; 361/813, 820, 760; 174/260, 174/261, 52.1, 52.4; 338/22 R, 314
See application file for complete search history.

(56) References Cited

U.S. PATENT DOCUMENTS 6,164,523 A * 12/2000 Fauty et al. .............. 228/180.5
6,307,755 B1 * 10/2001 Williams et al. ............ 361/813
6,498,561 B2 * 12/2002 Lavenuta .................. 338/22 R
6,653,215 B1 * 11/2003 Brown et al. ................ 438/600
6,653,738 B2 * 11/2003 Uchida et al. ............... 257/762
6,740,906 B2 * 5/2004 Slater et al. .................... 257/99
6,774,466 B1 * 8/2004 Kajiwara et al. ............. 257/673
7,022,550 B2 * 4/2006 Venugopalan ............... 438/108
7,045,831 B2 * 5/2006 Narazaki ..................... 257/177
7,220,617 B2 * 5/2007 Kagii et al. .................. 438/106
2003/0122232 A1 * 7/2003 Hirano et al. ............... 257/678
2004/0084770 A1 5/2004 Skocki ....................... 257/737

FOREIGN PATENT DOCUMENTS

JP 63-289956 11/1988
JP 2000-114302 4/2000

* cited by examiner

*Primary Examiner*—Chris C. Chu
(74) *Attorney, Agent, or Firm*—Oblon, Spivak, McClelland, Maier & Neustadt, P.C.

(57) ABSTRACT

A semiconductor device comprises: a semiconductor chip; a first frame; a solder layer which bonds the solder bonding metal layer of the semiconductor chip and the first frame; and a second frame bonded to the rear face of the semiconductor chip. The semiconductor chip includes: a semiconductor substrate; a first metal layer provided on a major surface of the semiconductor substrate and forming a Schottky junction with the semiconductor substrate; a second metal layer provided on the first metal layer and primarily composed of aluminum; a third metal layer provided on the second metal layer and primarily composed of molybdenum or titanium; and a solder bonding metal layer provided on the third metal layer and including at least a fourth metal layer which is primarily composed of nickel, ion or cobalt.

13 Claims, 10 Drawing Sheets

SEMICONDUCTOR DEVICE AND METHOD OF MANUFACTURING SAME

CROSS-REFERENCE TO RELATED APPLICATIONS

This application is based upon and claims the benefit of priority from the prior Japanese Patent Application No. 2004-202989, filed on Jul. 9, 2004; the entire contents of which are incorporated herein by reference.

BACKGROUND OF THE INVENTION

This invention relates to a semiconductor device in which a semiconductor chip (hereinafter referred to as "chip") is electrically solder bonded to a frame serving as an external terminal, and to its surface laminated electrode structure and a method of manufacturing the semiconductor device.

Schottky barrier diodes (SBD) and Zener diodes often have a junction near the metal surface. For such semiconductor device products, there is an existing technology in which an aluminum (Al) layer is sandwiched in a laminated electrode on the surface (Japanese Laid-Open Patent Applications 2000-114302 and 63-289956 (1988)). Such existing semiconductor devices have the following problems:

1. A Schottky barrier diode having the conventional metal structure (low $V_F$-SBD and low IR-SBD) will be described.

With respect to this diode, when Schottky metal (in general, high melting point metal such as V and Ti is used) is formed on a silicon semiconductor substrate surface, its protecting film (typically high melting point metal such as Mo, like the Schottky metal) is consecutively formed at the same time. This is carried out in order to prevent the Schottky surface from being damaged during a heat treatment step (performed for the purpose of controlling the Schottky metal to have a prescribed work function, ($\phi$B) when the process is advanced from the metal film patterning step to the heat treatment step.

Next, oxide film on the protecting film formed during the heat treatment is removed and a solder bonding metal layer (composed of: two-layer bonding material made of a Ni layer and a V or Ti layer; bonding material made of a Ni layer to be contacted with assembly solder; and antioxidant film for Ni made of a Au or Ag (silver) layer) is formed. After its patterning, a chip having finally three to five layers of surface metal is completed. The top and rear of the chip are then bonded to upper and lower frames (conductive metal on the substrate or strip) with assembly solder to complete a diode.

In this structure, typically, if there is any thin portion of assembly solder, the chip surface is directly susceptible to rapid heating during assembly of upper and lower frames, rapid heating during installation on a customer site, and/or frame stress due to temperature difference in the commercial use environment. This causes stress on the surface junction, and junction breakdown may occur due to the stress.

2. Next, the case of pn junction chip products including shallow junction chip products (Xj being 3 μm or less, e.g., constant voltage diode having low withstand voltage) will be described.

In manufacturing this product, a solder bonding metal layer (composed of: bonding material made of a V or Ti layer to be contacted with silicon; bonding material made of a Ni layer to be contacted with assembly solder; and antioxidant film for Ni made of a Au or Ag layer) is formed on a surface junction of the silicon semiconductor substrate. After its patterning, a chip having finally three layers of surface metal is completed. Subsequently, during assembly, the top and rear of the chip are bonded to upper and lower frames (conductive metal on the substrate or strip) with assembly solder to complete a diode.

In this structure again, typically, if there is any thin portion of assembly solder, the chip surface is directly susceptible to rapid heating during assembly of upper and lower frames, rapid heating during installation on a customer site, and/or frame stress due to temperature difference in the commercial use environment. This causes stress on the surface junction, and junction breakdown may occur due to the stress.

SUMMARY OF THE INVENTION

According to an aspect of the invention, there is provided a semiconductor device comprising:
a semiconductor chip including:
a semiconductor substrate;
a first metal layer provided on a major surface of the semiconductor substrate and forming a Schottky junction with the semiconductor substrate;
a second metal layer provided on the first metal layer and primarily composed of aluminum;
a third metal layer provided on the second metal layer and primarily composed of molybdenum or titanium; and
a solder bonding metal layer provided on the third metal layer and including at least a fourth metal layer which is primarily composed of nickel, ion or cobalt;
a first frame;
a solder layer which bonds the solder bonding metal layer of the semiconductor chip and the first frame; and
a second frame bonded to the rear face of the semiconductor chip.

According to other aspect of the invention, there is provided a semiconductor device comprising:
a semiconductor chip including:
a semiconductor substrate having a diffusion region that is formed in a surface region of a major surface thereof and constitutes a p-n junction;
a first metal layer provided on the major surface of the semiconductor substrate and primarily composed of aluminum;
a second metal layer provided on the first metal layer and primarily composed of molybdenum or titanium; and
a solder bonding metal layer provided on the second metal layer and including at least a third metal layer which is primarily composed of nickel, ion or cobalt;
a first frame;
a solder layer which bonds the solder bonding metal layer of the semiconductor chip and the first frame; and
a second frame bonded to the rear face of the semiconductor chip.

According to other aspect of the invention, there is provided a method of manufacturing a semiconductor device comprising:
forming a laminated structure on a major surface of a semiconductor substrate, the laminated structure including at least a first metal layer that forms a Schottky junction with the semiconductor substrate, a second metal layer primarily composed of aluminum, and a third metal layer primarily composed of molybdenum or titanium;
patterning the laminated structure into a predetermined configuration;
forming a solder bonding metal layer including at least nickel, ion or cobalt on the major surface of the semiconductor substrate having the patterned laminated structure formed thereon;

patterning the solder bonding metal layer into a pattern configuration identical to that of the laminated structure;

cutting the semiconductor substrate on which the laminated structure and the solder bonding metal layer are patterned to form a plurality of semiconductor chips; and bonding the semiconductor chip to a first frame using at least one solder layer formed on the solder bonding metal layer on the major surface of the semiconductor substrate, and bonding the rear face of the semiconductor chip to a second frame.

BRIEF DESCRIPTION OF THE DRAWINGS

FIG. 1C is a cross-sectional view of a chip 1 thereof, according to a first embodiment of the invention;

DETAILED DESCRIPTION OF THE INVENTION

Embodiments of the invention will now be described with reference to examples.

FIRST EXAMPLE

The first example of the invention is now described with reference to FIGS. 1A to 1C and 2A to 2D.

Figure 1A:
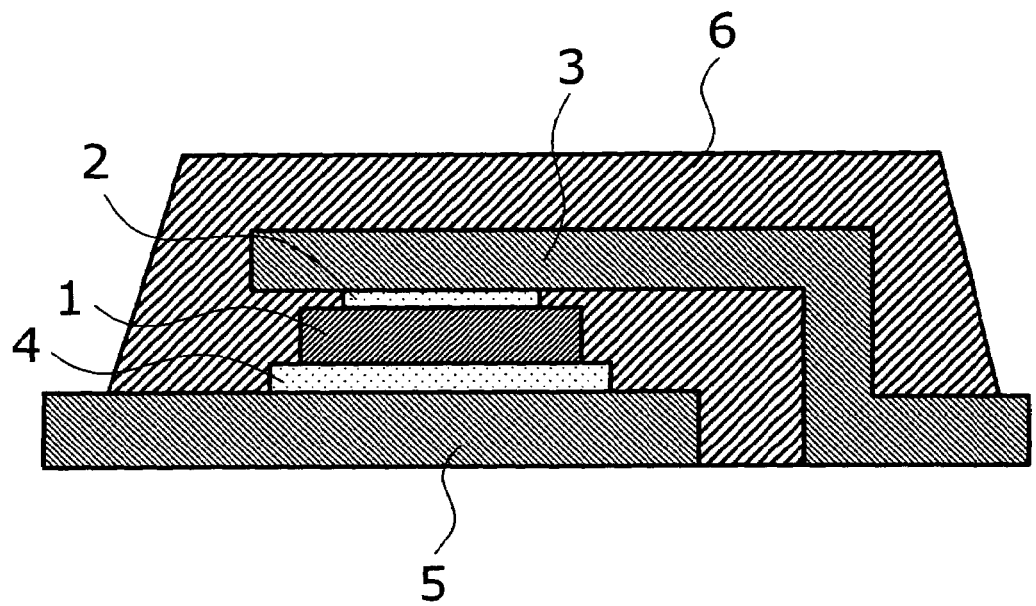
FIGS. 1A to 1C are cross-sectional and plan views of a low $V_F$ Schottky barrier diode.
Figure 1B:
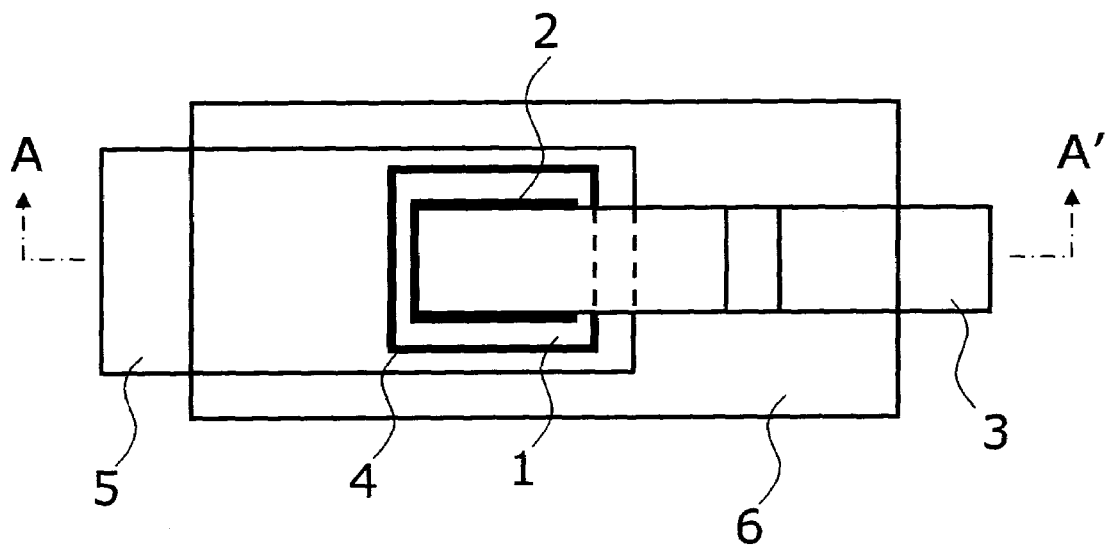
Figure 1C:
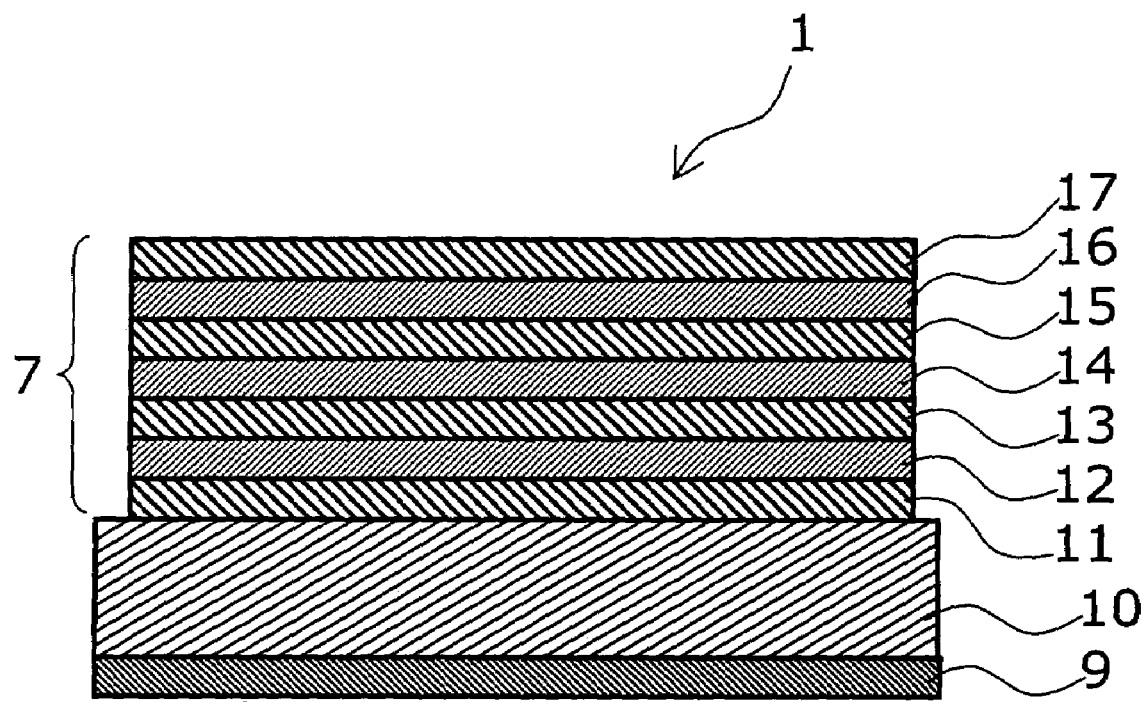

FIGS. 1A and 1B are cross-sectional and plan views of a low $V_F$ Schottky barrier diode, and FIG. 1C is a cross-sectional view of a chip 1.

FIGS. 2A to 2D are process cross-sectional views illustrating a method of forming a surface laminated electrode structure used in soldering to the chip an upper frame serving as an external terminal. That is, FIGS. 2A to 2D are cross-sectional views of a process up to the step of cutting out a chip from the silicon semiconductor substrate.

As shown in FIGS. 1A to 1C, the chip 1 is sandwiched between an upper frame 3 and a lower frame 5 serving as external terminals, and is bonded thereto with solder layers 2 and 4. The upper and lower frames 3, 5 and the chip 1 are resin sealed with resin sealant 6 such as epoxy (FIGS. 1A to 1C). A laminated electrode structure 7 including a Schottky metal layer is formed on the surface of the chip 1 sandwiched between the upper and lower frames 3, 5 so that the chip 1 may be solder bonded to the upper frame 3 (FIGS. 2A to 2D).

Each chip including the semiconductor substrate 10 of this example has a laminated electrode structure formed thereon. The laminated electrode structure is composed of a Schottky metal layer (first layer) 11 of V or Ti film having a film thickness of 0.1 to 0.3 μm, a Mo or Ti layer (second layer) 12 having a film thickness of 0.1 to 0.4 μm serving as protecting film for Schottky metal, an Al layer (third layer) 13 having a film thickness of 0.5 to 1.0 μm serving as protecting film used for buffer film, a Mo layer (fourth layer) 14 having a film thickness of 0.1 to 0.4 μm serving as protecting film for aluminum, a V or Ti layer (fifth layer) 15 having a film thickness of 0.02 to 0.05 μm serving as a first solder bonding layer, a Ni layer (sixth layer) 16 having a film thickness of 0.1 to 0.4 μm serving as a second solder bonding layer of bonding material to be contacted with solder, and a Au, Ag, or Pt or their alloyed layer (seventh layer) 17 having a film thickness of 0.03 to 0.2 μm serving as a third solder bonding layer of antioxidation film for Ni. One of these layers is Schottky metal 11, and the three upper layers 15, 16, and 17 constitute a bonding metal layer 8 to be contacted with solder.

Next, a method of manufacturing the semiconductor device shown in FIG. 2 will be described.

Figure 2A:
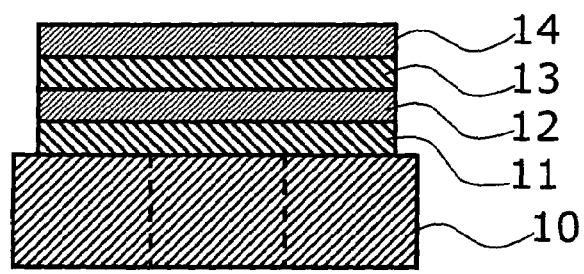
FIGS. 2A to 2D are cross-sectional views of a process up to the step of cutting out a chip from the silicon semiconductor substrate according to the first embodiment of the invention.

First, on a semiconductor substrate 10 of silicon or the like to be eventually cut into chips, existing methods are used to laminate four metal layers composed of Schottky metal 11 of V or Ti, a Mo or Ti layer 12 serving as protecting film for the Schottky metal, an Al layer 13 serving as protecting film used for buffer film, and a Mo layer 14 serving as protecting film for aluminum (FIG. 2A).

Figure 2B:
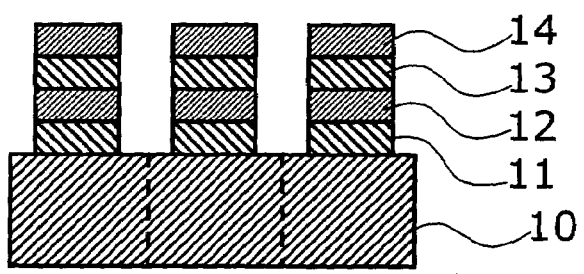

Next, these laminated metal layers 11 to 14 are patterned by wet etching or the like to leave these metal layers on each chip formation region of the semiconductor substrate 10. Subsequently, the semiconductor substrate 10 is heat treated to sinter the Schottky metal (FIG. 2B).

Next, after oxide film formed on the surface of the Mo layer 14 due to the heat treatment is removed, a solder bonding metal layer 8 is formed on the semiconductor substrate 10 including the Mo layer 14. The solder bonding metal layer 8 is composed of three layers: a V or Ti layer 15, a Ni layer 16 serving as bonding material to be contacted with solder, and a Au or Ag layer 17 serving as antioxidation film for Ni.

Figure 2C:
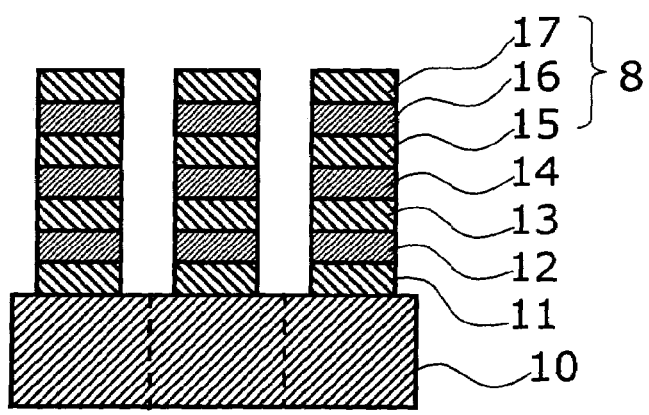

Next, these laminated metal layers 15 to 17 are patterned by wet etching or the like to leave these metal layers on each chip formation region of the semiconductor substrate 10. Since etching is performed for each metal layer, three iterations of etching are performed in total (FIG. 2C).

Next, a rear face metal layer 9 is formed on the rear face of the semiconductor substrate 10.

Figure 2D:
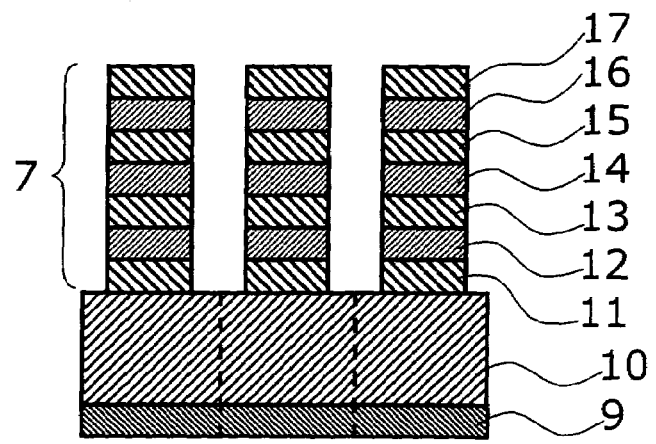

The semiconductor substrate 10 is then diced along the boundary of the chip formation region shown by dashed lines to form a plurality of chips having the laminated electrode structure (FIG. 2D).

Next, upper and lower frames 3, 5 are attached to the chip 1 with solder to form a semiconductor device (see FIG. 1).

In the background technology described above, only a Mo layer is provided on the Schottky metal for its protection. On the contrary, in this example, protecting film composed of an Al layer and a Mo layer thereon is added to form a seven-layer laminated electrode structure 7.

In this example, the aluminum layer 13 achieves an effect of buffering stress. More specifically, aluminum can serve as soft buffering material for reducing stress on the Schottky metal such as solder stress during assembly of the semiconductor device, rapid heating stress during installation of the semiconductor device on a customer site, and stress due to temperature difference in a commercial actual use environment.

In addition, Mo is less prone to formation of intermetallic compound with V or Ti. That is, the Mo layer 14 laminated on the Al layer 13 can prevent the formation of intermetallic compound with the V or Ti layer 15 thereon. This results in a semiconductor device that is free from deterioration of electric characteristics ($V_F$ loss) due to the formation of intermetallic compound, and from junction breakdown due to the stress on the Schottky metal.

Furthermore, the thick aluminum layer 13 added to the entire surface of the chip serves to spread current across the chip, which has an effect of reducing $V_F$ loss and improving surge current capacity (overcurrent breakdown capacity). As a result, it is possible to manufacture and market semiconductor devices with improved product yield and high reliability and functionality, and without concern about failure on a customer site and in the market.

On the other hand, various companies are currently taking measures to complete Pb-free (lead-free) devices. In this respect, Sn-based solder is about to be substituted for Pb-based solder. However, use of Sn-based solder causes increase of stress. Reducing this stress is also an effect achieved by the Al—Mo structure of the present example. In particular, a great effect can be expected in a semiconductor device intended for in-vehicle or other applications used in a severe temperature environment.

In the laminated electrode structure described above, the second metal layer (Mo or Ti layer) 12 formed for protecting the Schottky metal is formed as needed, and is not an indispensable constituent material in the invention. The fifth V or Ti layer formed on the fourth Mo layer serving as protecting film is formed as needed, and is not an indispensable constituent material in the invention.

The fifth Ni layer to be contacted with solder is not limited to this material. In this example, instead of the Ni layer, a Co or Fe layer can also be used. Furthermore, in this example, the film thickness of the third Al layer can be greater than the film thickness of the first layer (Schottky metal), the second layer (protecting film for the Schottky metal), and the fourth layer (protecting film for aluminum). In addition, the Al layer can be twice or more as thick as the film thickness of its upper or lower metal layer.

In this example, the four-layer laminated metal layer is patterned before heat treating the semiconductor substrate 10 to sinter the Schottky metal 11 (see FIG. 2B). This is carried out in order to control φB (work function of the Schottky portion). In addition, in this example, the first to seventh layers (lamination of the fifth layer may be omitted) can be formed on the semiconductor substrate to form a laminated electrode structure before the sixth and seventh layers are patterned. Furthermore, in this example, the first to seventh layers (lamination of the fifth layer may be omitted) can be consecutively formed on the semiconductor substrate to form a laminated electrode structure before this structure is patterned and then heat treated.

SECOND EXAMPLE

The second example of the invention is now described with reference to FIGS. 3A to 3E.

FIGS. 3A to 3D are process cross-sectional views illustrating a method of forming a surface laminated electrode structure used in soldering to the chip an upper frame serving as an external terminal. That is, FIGS. 3A to 3D are cross-sectional views of a process up to the step of cutting out a chip from the silicon semiconductor substrate.

Figure 3A:
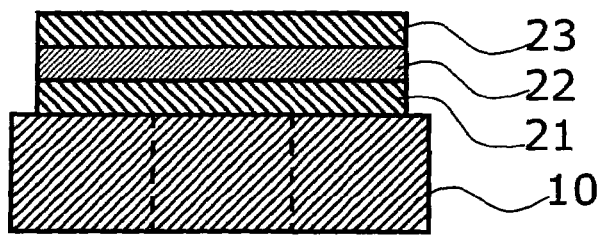
FIGS. 3A to 3D are process cross-sectional views illustrating a method of forming a surface laminated electrode structure used in soldering to the chip an upper frame serving as an external terminal.
Figure 3B:
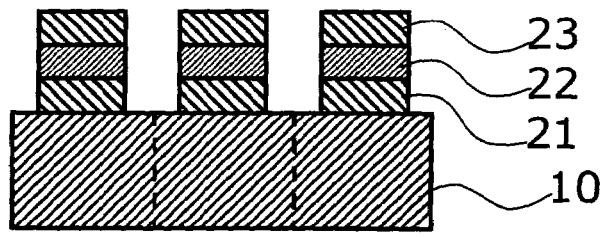
Figure 3C:
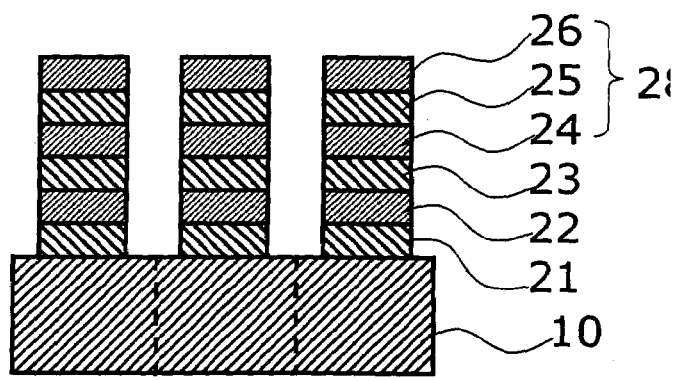
Figure 3D:
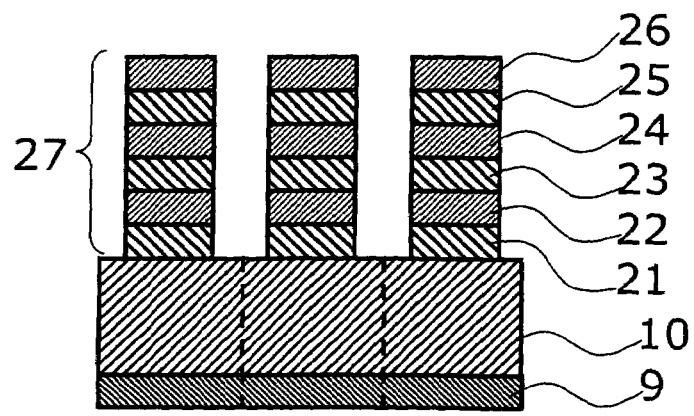
Figure 3E:
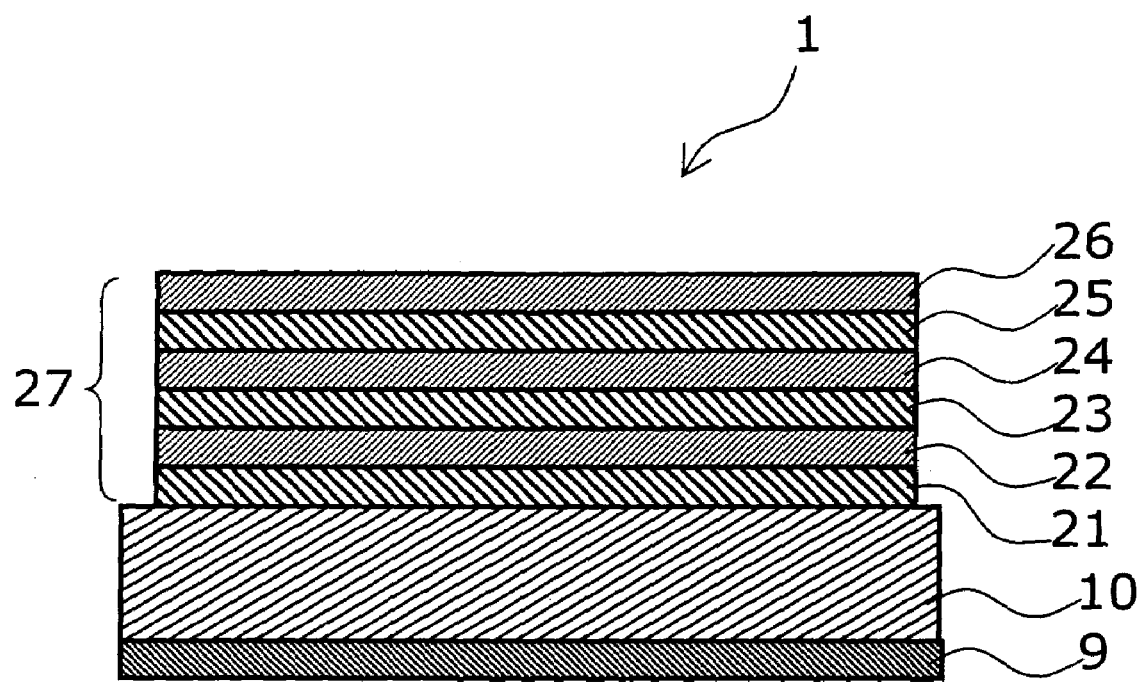
FIG. 3E is a sectional view illustrating the finished chip.

FIG. 3E is a sectional view illustrating the finished chip.

A semiconductor device used in this example is a Schottky barrier diode of low-IR type. A complete structure thereof having upper and lower frames is basically the same as the one shown in FIGS. 1A and 1B, therefore, a detailed explanation thereof will be appropriately omitted.

Each chip including the semiconductor substrate 10 of this example has a laminated electrode structure 27 formed thereon. The laminated electrode structure 27 includes a Schottky metal layer (first layer) 21 of V or Ti film having a film thickness of 0.1 to 0.5 μm, an Al layer (second layer) 22 having a film thickness of 0.5 to 1.0 μm serving as protecting film used for buffer film, a Mo layer (third layer) 23 having a film thickness of 0.1 to 0.5 μm serving as protecting film for aluminum, a V or Ti layer (fourth layer) 24 having a film thickness of 0.02 to 0.05 μm serving as a first solder bonding layer, a Ni layer (fifth layer) 25 having a film thickness of 0.1 to 0.4 μm serving as a second solder bonding layer of bonding material to be contacted with solder, and a Au, Ag, or Pt or their alloyed layer (sixth layer) 26 having a film thickness of 0.03 to 0.2 μm serving as a third solder bonding layer of antioxidation film for Ni. One of these layers is Schottky metal 21, and the three upper layers 24, 25, and 26 constitute a bonding metal layer 28 to be contacted with solder.

Next, a method of manufacturing the semiconductor device shown in FIGS. 3A through 3D will be described.

First, on a semiconductor substrate 10 of silicon or the like to be eventually cut into chips, existing methods are used to laminate three metal layers composed of Schottky metal 21 of V or Ti, an Al layer 22 serving as protecting film used for buffer film, and a Mo layer 23 serving as protecting film for aluminum (FIG. 3A).

Next, these laminated metal layers 21 to 23 are patterned by wet etching or the like to leave these metal layers on each chip formation region of the semiconductor substrate 10. Subsequently, the semiconductor substrate 10 is treated with heat to sinter the Schottky metal (FIG. 3B).

Next, after oxide film formed on the surface of the Mo layer 23 due to the heat treatment is removed, a solder bonding metal layer 28 is formed on the semiconductor substrate 10 including the Mo layer 23. The solder bonding metal layer 28 is composed of three layers: a V or Ti layer 24, a Ni layer 25 serving as bonding material to be contacted with solder, and a Au or Ag layer 26 serving as antioxidation film for Ni.

Next, these laminated metal layers 24 to 26 are patterned by wet etching or the like to leave these metal layers on each chip formation region of the semiconductor substrate 10. Since etching is performed for each metal layer, three iterations of etching are performed in total (FIG. 3C).

Next, a rear face metal layer 9 is formed on the rear face of the semiconductor substrate 10.

The semiconductor substrate 10 is then diced along the boundary of the chip formation region shown by dashed lines to form a plurality of chips having the laminated electrode structure (FIG. 3D).

Next, upper and lower frames 3, 5 are attached to the chip 1 with solder to form a semiconductor device (see FIGS. 1A and 1B).

In this example, protecting film composed of an Al layer formed on the Schottky metal and a Mo layer formed on Al layer is added to form a six-layer laminated electrode structure.

In this example, aluminum can serve as soft buffering material for reducing stress on the Schottky metal such as solder stress during assembly of the semiconductor device, rapid heating stress during installation of the semiconductor device on a customer site, and stress due to temperature difference in a commercial actual use environment.

In addition, Mo is less prone to formation of intermetallic compound with V or Ti. That is, the Mo layer 14 laminated on the Al layer 13 can prevent the formation of intermetallic compound with the V or Ti layer 15 thereon. This results in a semiconductor device that is free from deterioration of electric characteristics ($V_F$ loss) due to the formation of intermetallic compound, and from junction breakdown due to the stress on the Schottky metal.

Furthermore, the thick aluminum layer 22 added to the entire surface of the chip serves to spread current across the chip, which has an effect of reducing $V_F$ loss and improving surge current capacity (overcurrent breakdown capacity). As a result, it is possible to manufacture and market semiconductor devices with improved product yield and high reliability and functionality, and without concern about failure on a customer site and in the market.

On the other hand, various companies are currently taking measures to complete Pb-free (lead-free) devices. In this respect, Sn-based solder is about to be substituted for Pb-based solder. However, use of Sn-based solder causes increase of stress. Reducing this stress is also an effect achieved by the Al—Mo structure of the present example. In particular, a great effect can be expected in a semiconductor device intended for in-vehicle or other applications used in a severe temperature environment.

The fourth V or Ti layer 24 formed on the third Mo layer 23 serving as protecting film is formed as needed, and is not an indispensable constituent material in the invention.

The fifth Ni layer 25 to be contacted with solder is not limited to this material. In this example, instead of the Ni layer, a Co or Fe layer can also be used. Furthermore, in this example, the film thickness of the second Al layer 22 can be greater than the film thickness of the first layer (Schottky metal) 21, and the fourth layer (protecting film for aluminum) 24. In addition, the Al layer 22 can be twice or more as thick as the film thicknesses of its upper or lower metal layers.

In this example, the thee-layer laminated metal layer is patterned before heat treating the semiconductor substrate 10 to sinter the Schottky metal 11 (see FIG. 3B). This is carried out in order to control (φB (work function of the Schottky portion). Alternatively, the fourth layer 24 through sixth layer 26 can be formed and patterned at the same time.

In addition, in formation of laminated metal layer 27 of this example, V or Ti layer 24 may be omitted. That is, five-layer laminated metal layer including a Schottky metal layer (first layer), Al layer (second layer), Mo or Ti layer (third layer), Ni layer (fourth layer) and a Au, Ag, or Pt or their alloyed layer are continuously formed without V or Ti layer on Mo layer (fourth layer) may be formed and patterned before the laminated metal layer is treated with heat.

Alternatively, in this example, the first to sixth layers can be consecutively formed on the semiconductor substrate to form a laminated electrode structure before this structure is patterned and then heat treated.

THIRD EXAMPLE

The third example of the invention is now described with reference to FIGS. 4A to 4E.

FIGS. 4A to 4D are process cross-sectional views illustrating a method of forming a surface laminated electrode structure used in soldering to the chip an upper frame serving as an external terminal. That is, FIGS. 4A to 4D are cross-sectional views of a process up to the step of cutting out a chip from the silicon semiconductor substrate.

Figure 4A:
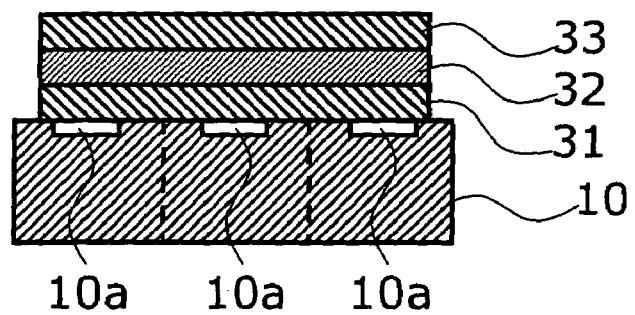
FIGS. 4A to 4D are process cross-sectional views illustrating a method of forming a surface laminated electrode structure used in soldering to the chip an upper frame serving as an external terminal.
Figure 4B:
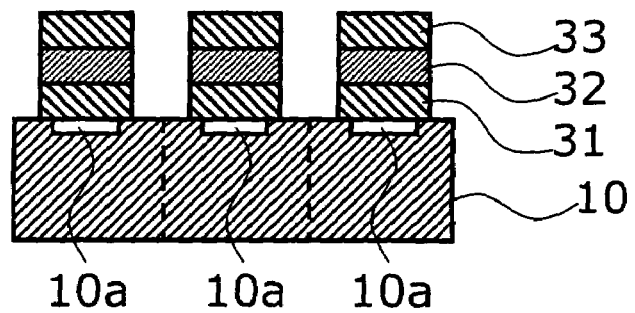
Figure 4C:
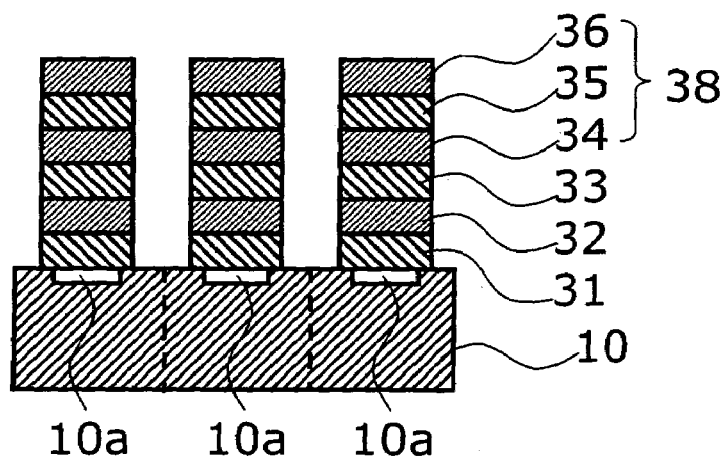
Figure 4D:
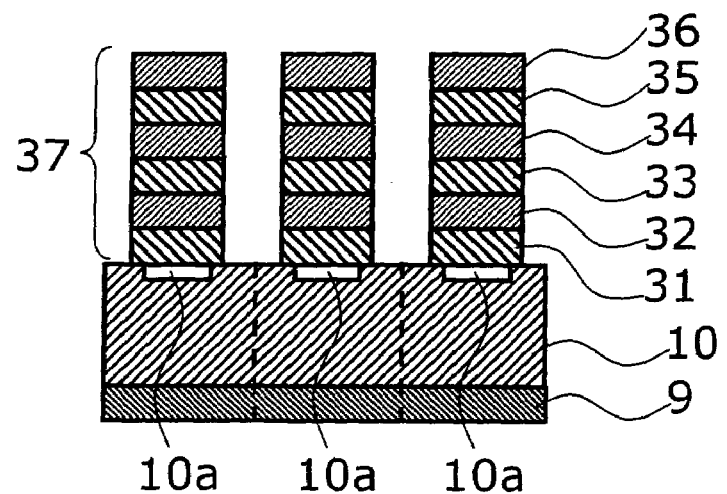
Figure 4E:
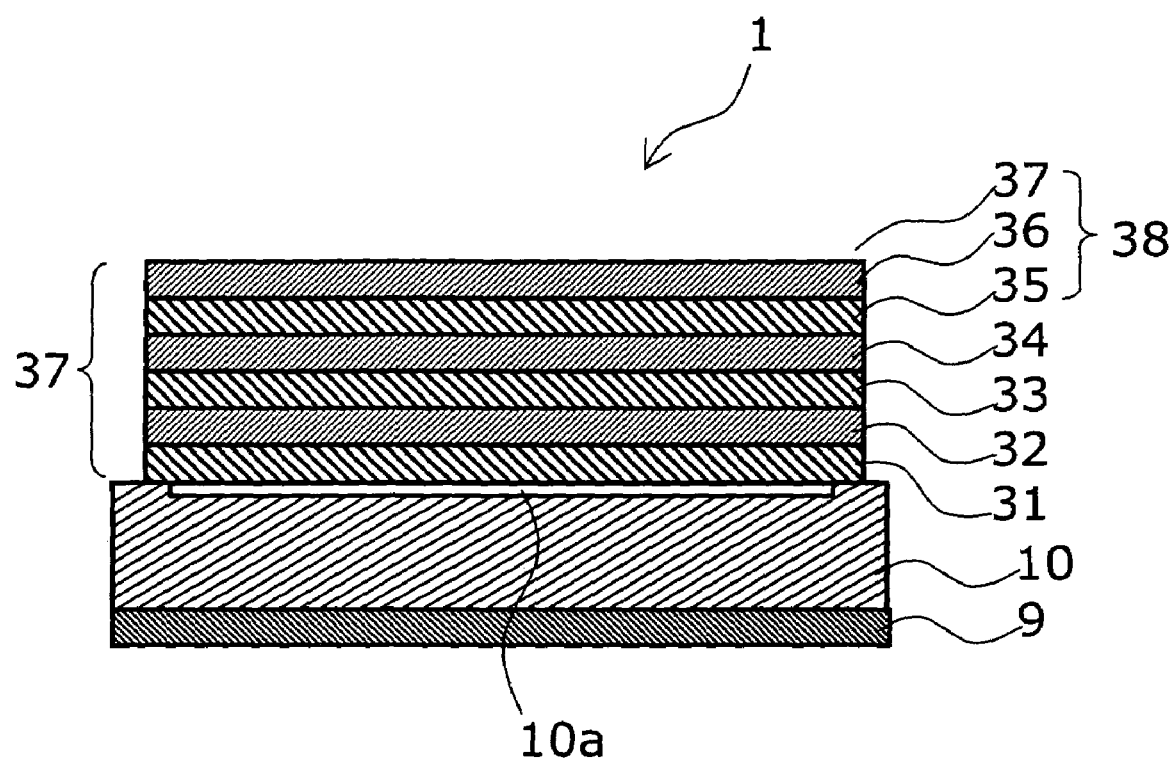
FIG. 4E is a sectional view illustrating the finished chip.

FIG. 4E is a sectional view illustrating the finished chip.

A semiconductor device used in this example is a low breakdown constant voltage diode of shallow-junction type such as a Zener diode. A complete structure thereof having upper and lower frames is basically the same as the one shown in FIGS. 1A and 1B, therefore, a detailed explanation thereof will be appropriately omitted.

Each chip region including the semiconductor substrate 10 of this example has a laminated electrode structure 37 formed thereon.

The laminated electrode structure 37 is composed of a Mo or Ti layer (first layer) 31 film having a film thickness of 0.1 to 0.5 μm serving as protecting film for spike prevention, an Al layer (second layer) 32 having a film thickness of 0.5 to 1.0 μm serving as protecting film used for buffer film, a Mo or Ti layer (third layer) 33 having a film thickness of 0.1 to 0.5 μm serving as protecting film for aluminum, a V or Ti layer (fourth layer) 34 having a film thickness of 0.02 to 0.05 μm serving as a first solder bonding layer, a Ni layer (fifth layer) 35 having a film thickness of 0.1 to 0.4 μm serving as a second solder bonding layer of bonding material to be contacted with solder, and a Au, Ag, or Pt or their alloyed layer (sixth layer) 36 having a film thickness of 0.03 to 0.2 μm serving as a third solder bonding layer of antioxidation film for Ni. Three upper layers 34, 35, and 36 in the laminated electrode structure 37 constitute a bonding metal layer 38 to be contacted with solder. In a surface shallow region of the substrate 10, a diffused layer 10a which forms a shallow junction is formed.

Next, a method of manufacturing the semiconductor device shown in FIG. 4 will be described.

First, on a semiconductor substrate 10 of silicon or the like to be eventually cut into chips, existing methods are used to laminate three metal layers composed of a Mo or Ti layer 31 film serving as protecting film for spike prevention, an Al layer 32 serving as protecting film used for buffer film, a Mo or Ti layer 33 serving as protecting film for aluminum (FIG. 4A).

Next, these laminated metal layers 31 to 33 are patterned by wet etching or the like to leave these metal layers on each chip formation region of the semiconductor substrate 10. Subsequently, the semiconductor substrate 10 is heat treated to sinter the Schottky metal (FIG. 4B).

Next, after oxide film formed on the surface of the Mo layer 33 due to the heat treatment is removed, a solder bonding metal layer 38 is formed on the semiconductor substrate 10 including the Mo layer 33. The solder bonding metal layer 38 is composed of three layers: a V or Ti layer 34, a Ni layer 35 serving as bonding material to be contacted with solder, and a Au, Ag, Pt or their alloyed layer 36 serving as antioxidation film for Ni.

Next, these laminated metal layers 34 to 36 are patterned by wet etching or the like to leave these metal layers on each chip formation region of the semiconductor substrate 10. Since etching is performed for each metal layer, three iterations of etching are performed in total (FIG. 4C).

Next, a rear face metal layer 9 is formed on the rear face of the semiconductor substrate 10.

The semiconductor substrate 10 is then diced along the boundary of the chip formation region shown by dashed lines to form a plurality of chips having the laminated electrode structure 37 (FIG. 4D).

Next, upper and lower frames 3, 5 are attached to the chip 1 with solder to form a semiconductor device (see FIGS. 1A and 1B).

In the background technology described above, only a Mo layer is provided on the Schottky metal for its protection. In contrast to this, in this example, protecting film composed of an Al layer and a Mo layer thereon is added to form a six-layer laminated electrode structure.

In this example, the aluminum layer 32 achieves an effect of buffering stress. More specifically, aluminum can serve as soft buffering material for reducing stress on the Schottky metal such as solder stress during assembly of the semiconductor device, rapid heating stress during installation of the semiconductor device on a customer site, and stress due to temperature difference in a commercial actual use environment.

In addition, Mo is less prone to formation of intermetallic compound with V or Ti. That is, the Mo layer 33 laminated on the Al layer 32 can prevent the formation of intermetallic compound with the V or Ti layer 34 thereon. This results in a semiconductor device that is free from deterioration of electric characteristics ($V_F$ loss) due to the formation of intermetallic compound, and from junction breakdown due to the stress on the Schottky metal.

Furthermore, the thick aluminum layer 32 added to the entire surface of the chip serves to spread current across the chip, which has an effect of reducing $V_F$ loss and improving surge current capacity (overcurrent breakdown capacity). As a result, it is possible to manufacture and market semiconductor devices with improved product yield and high reliability and functionality, and without concern about failure on a customer site and in the market.

On the other hand, various companies are currently taking measures to complete Pb-free (lead-free) devices. In this respect, Sn-based solder is about to be substituted for Pb-based solder. However, use of Sn-based solder causes increase of stress. Reducing this stress is also an effect achieved by the Al—Mo structure of the present example. In particular, a great effect can be expected in a semiconductor device intended for in-vehicle or other applications used in a severe temperature environment.

In a semiconductor device using this example, the Al layer 32 serving as stress buffer and current diffuser can be formed sufficiently thicker than two layers adjoining both sides of the Al layer 32. The Al layer 32 may be formed twice or more as thick as two adjacent layers thereof.

In addition, in formation of laminated metal layer 37 of this example, V or Ti layer 34 may be omitted. That is, a Ni layer (fourth layer) serving as bonding material to be contacted with solder and a Au, Ag, Pt or their alloyed layer (fifth layer) serving as antioxidation film for Ni can be formed and patterned to form the solder bonding metal layer 38

FOURTH EXAMPLE

The fourth example of the invention is now described with reference to FIGS. 5A through 6D.

Figure 5A:
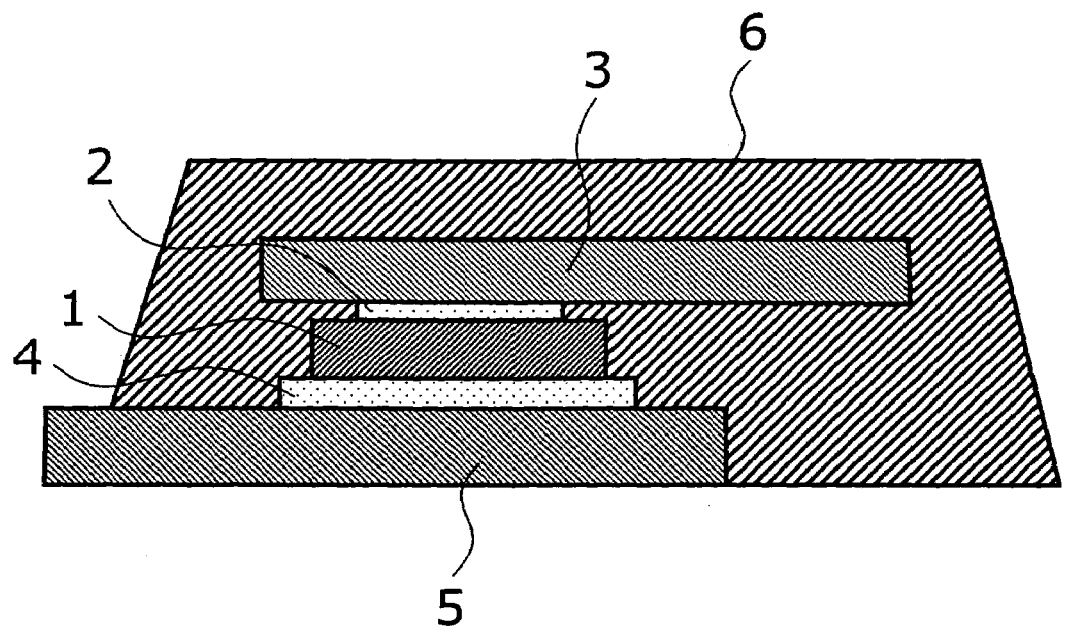
FIGS. 5A and 5B are cross-sectional and plan views of p-n junction products containing bipolar transistor, MOS transistor, and the like without shallow junction chip.
Figure 5B:
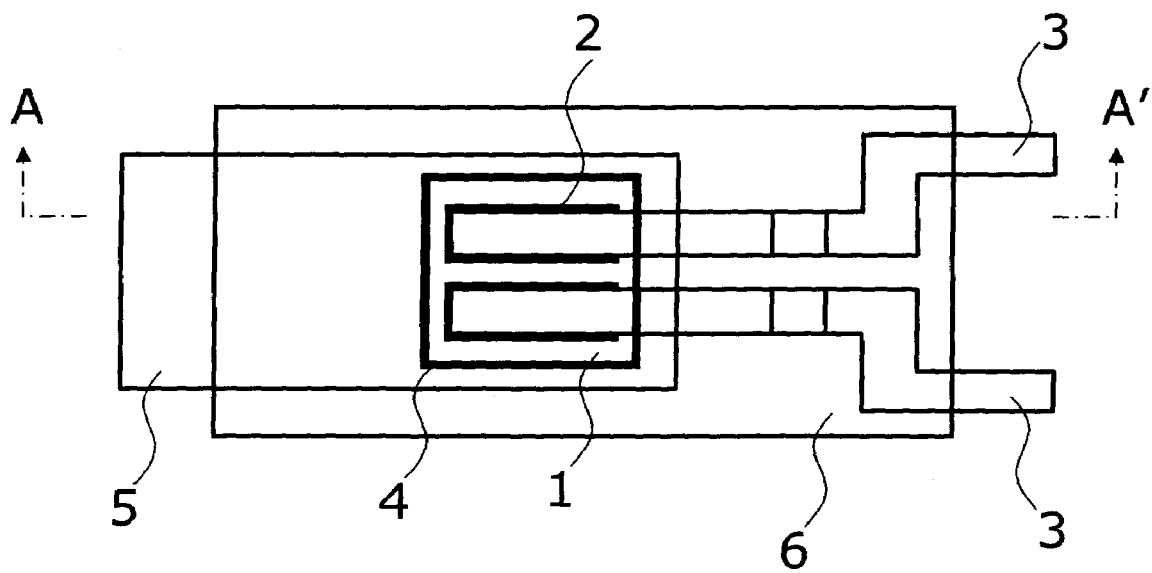
Figure 5C:
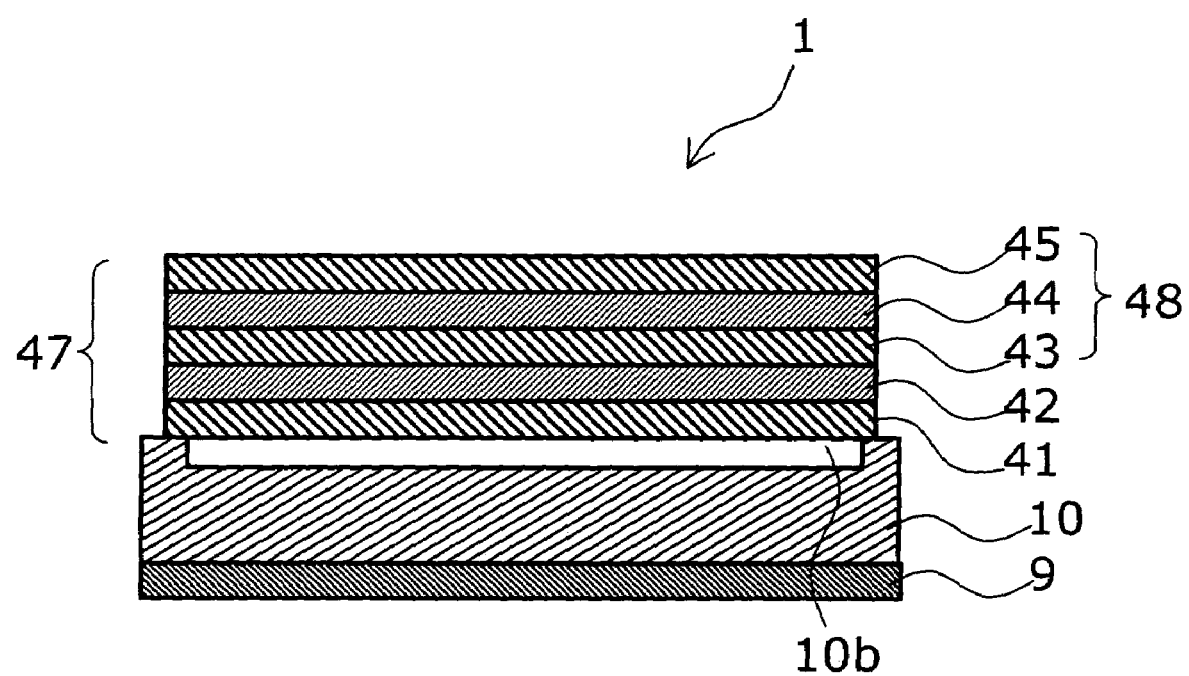
FIG. 5C is a cross-sectional view of a chip 1.

FIGS. 5A and 5B are cross-sectional and plan views of p-n junction products containing bipolar transistor, MOS transistor, and the like without shallow junction chip, and FIG. 5C is a cross-sectional view of a chip 1.

FIGS. 6A to 6D are process cross-sectional views illustrating a method of forming a surface laminated electrode structure used in soldering an upper frame serving as an external terminal to the chip. That is, FIGS. 6A to 6D are cross-sectional views of a process up to the step of cutting out a chip from the silicon semiconductor substrate.

As shown in FIGS. 5A and 5B, the chip 1 is sandwiched between an upper frame 3 and a lower frame 5 serving as external terminals, and is bonded thereto with solder layers 2 and 4. The upper and lower frames 3, 5 and the chip 1 are resin sealed with resin sealant 6 such as epoxy. A laminated electrode structure including a Schottky metal layer is formed on the surface of the chip 1 sandwiched between the upper and lower frames 3, 5 so that the chip 1 may be solder bonded to the upper frame 3 (FIG. 5C).

Each chip including the semiconductor substrate 10 of this example has a laminated electrode structure 47 formed thereon. The laminated electrode structure 47 includes an Al layer (first layer) 41 having a film thickness of 0.5 to 1.0 μm serving as protecting film used for buffer film, a Mo or Ti layer (second layer) 42 having a film thickness of 0.1 to 0.4 μm serving as protecting film for aluminum, a V or Ti layer (third layer) 43 having a film thickness of 0.02 to 0.05 μm serving as a first solder bonding layer, a Ni layer (fourth layer) 44 having a film thickness of 0.1 to 0.4 μm serving as a second solder bonding layer of bonding material to be contacted with solder, and a Au, Ag, or Pt or their alloyed layer (fifth layer) 45 having a film thickness of 0.03 to 0.2 μm serving as a third solder bonding layer of antioxidation film for Ni. Three upper layers 43, 44, and 45 constitute a bonding metal layer 48 to be contacted with solder. In the surface region on the semiconductor substrate 10, a diffused layer 10b which forms a p-n junction is provided.

Next, a method of manufacturing the semiconductor device shown in FIGS. 6A through 6D will be described.

Figure 6A:
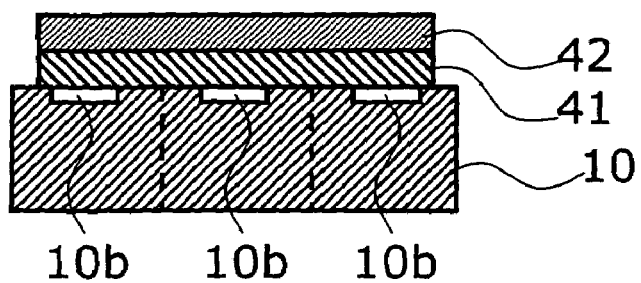
FIGS. 6A to 6D are process cross-sectional views illustrating a method of forming a surface laminated electrode structure used in soldering an upper frame serving as an external terminal to the chip.

First, on a semiconductor substrate 10 of silicon or the like to be eventually cut into chips, existing methods are used to laminate four metal layers composed of an Al layer 41 serving as protecting film used for buffer film, and a Mo layer 42 serving as protecting film for aluminum (FIG. 6A).

Figure 6B:
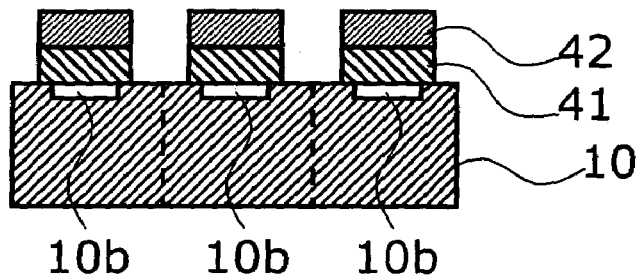

Next, these laminated metal layers 41 and 42 are patterned by wet etching or the like to leave these metal layers on each chip formation region of the semiconductor substrate 10. Subsequently, the semiconductor substrate 10 is heat treated (FIG. 6B).

Next, after oxide film formed on the surface of the Mo layer 42 due to the heat treatment is removed, a solder bonding metal layer 48 is formed on the semiconductor substrate 10 including the Mo layer 42. The solder bonding metal layer 48 is composed of three layers: a V or Ti layer 43, a Ni layer 44 serving as bonding material to be contacted with solder, and a Au, Ag or Pt layer 45 serving as antioxidation film for Ni.

Figure 6C:
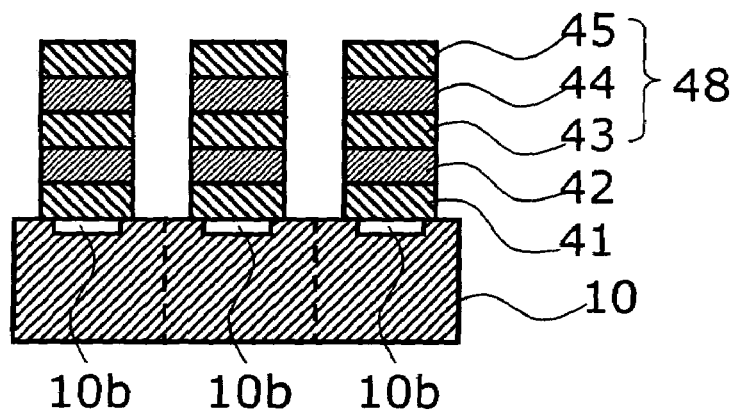

Next, these laminated metal layers 43 to 45 are patterned by wet etching or the like to leave these metal layers on each chip formation region of the semiconductor substrate 10. Since etching is performed for each metal layer, three iterations of etching are performed in total (FIG. 6C).

Next, a rear face metal layer 9 is formed on the rear face of the semiconductor substrate 10.

Figure 6D:
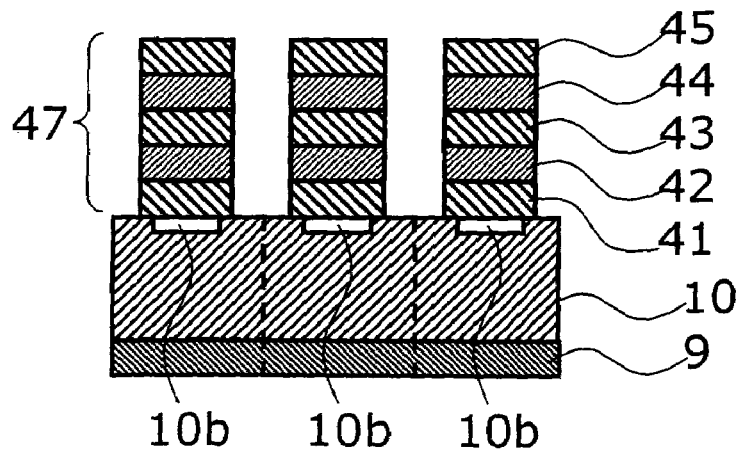

The semiconductor substrate 10 is then diced along the boundary of the chip formation region shown by dashed lines to form a plurality of chips having the laminated electrode structure 47 (FIG. 6D).

Next, upper and lower frames 3, 5 are attached to the chip 1 with solder to form a semiconductor device (see FIGS. 5A and 5B).

In the background technology described above, only a Mo layer is provided on the Schottky metal for its protection. On the contrary, in this example, protecting film composed of an Al layer and a Mo layer thereon is added to form a five-layer laminated electrode structure.

In this example, the aluminum layer 41 and the Mo layer 42 achieve an effect of buffering stress. More specifically, aluminum can serve as soft buffering material for reducing stress on the Schottky metal such as solder stress during assembly of the semiconductor device, rapid heating stress during installation of the semiconductor device on a customer site, and stress due to temperature difference in a commercial actual use environment.

In addition, Mo is less prone to formation of intermetallic compound with V or Ti. That is, the Mo layer 42 laminated on the Al layer 41 can prevent the formation of intermetallic compound with the V or Ti layer 43 thereon. This results in a semiconductor device that is free from deterioration of electric characteristics ($V_F$ loss) due to the formation of intermetallic compound, and from junction breakdown due to the stress on the Schottky metal.

Furthermore, the thick aluminum layer 41 added to the entire surface of the chip serves to spread current across the chip, which has an effect of reducing $V_F$ loss and improving surge current capacity (overcurrent breakdown capacity). As a result, it is possible to manufacture and market semiconductor devices with improved product yield and high reliability and functionality, and without concern about failure on a customer site and in the market.

On the other hand, various companies are currently taking measures to complete Pb-free (lead-free) devices. In this respect, Sn-based solder is about to be substituted for Pb-based solder. However, use of Sn-based solder causes increase of stress. Reducing this stress is also an effect achieved by the Al—Mo structure of the present example. In particular, a great effect can be expected in a semiconductor device intended for in-vehicle or other applications used in a severe temperature environment.

As an additional effect expected according to the example, the above-described structure having thick metal layers formed above and below the chip can be used to reduce assembly stress on the surface of a chip of a bipolar or MOS-FET transistor because the outermost surface on both sides of the chip to be solder bonded has thick metal layers (with step size being 0.5 µm or more) which protect the underlying p-n junction.

In a semiconductor device of this example, the Al layer 41 for stress reduction and current diffusion may be laminated sufficiently thicker than the Mo or Ti layer 42 thereon. This Al layer 41 may be twice or more as thick as the layer 42.

In the method of manufacturing a semiconductor device of this example, a total of four layers composed of the Al layer (first layer), Mo or Ti layer (second layer), Ni layer (third layer), and Au, Ag, or Pt or their alloyed film (fourth layer) can be consecutively formed, and thereafter this laminated metal film can be patterned and then heat treated. That is, the V or Ti layer 43 on the Mo layer 42 may be omitted. Alternatively, in the method of manufacturing a semiconductor device of this example, a total of five layers composed of the Al layer (first layer), Mo or Ti layer (second layer), the V or Ti layer (third layer) on the Mo layer, Ni layer (fourth layer), and Au, Ag, or Pt or their alloyed film (fifth layer) can be consecutively formed, and thereafter this laminated metal film can be patterned and then heat treated.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The invention claimed is:

1. A semiconductor device comprising:
   a semiconductor chip comprising:
      a silicon semiconductor substrate;
      a first metal layer provided on a major surface of the semiconductor substrate and forming a Schottky junction with the semiconductor substrate;
      a second metal layer provided on the first metal layer and primarily composed of aluminum;
      a third metal layer provided on the second metal layer and primarily composed of molybdenum or titanium, the third metal layer being in contact with the second metal layer; and
      a solder bonding metal layer provided on the third metal layer comprising at least a fourth metal layer which is primarily composed of nickel, iron or cobalt;
   a first frame;
   a solder layer which bonds the solder bonding metal layer of the semiconductor chip and the first frame; and
   a second frame bonded to the rear face of the semiconductor chip.

2. A semiconductor device according to claim 1, further comprising a fifth metal layer provided between the first and second metal layers and primarily composed of molybdenum or titanium.

3. The semiconductor device according to claim 2, wherein fifth metal layer consists of molybdenum or titanium.

4. A semiconductor device according to claim 1, wherein the first metal layer is primarily composed of vanadium or titanium.

5. The semiconductor device according to claim 4, wherein the first metal layer consists of vanadium or titanium.

6. A semiconductor device according to claim 1, further comprising a sixth metal layer provided between the third and fourth metal layers and primarily composed of vanadium or titanium.

7. The semiconductor device according to claim 6, wherein the sixth metal layer consists of vanadium or titanium.

8. A semiconductor device according to claim 1, wherein the second metal layer is thicker than its adjacent metal layers.

9. A semiconductor device according to claim 1, wherein the second metal layer is twice or more as thick as its adjacent metal layers.

10. A semiconductor device according to claim 1, further comprising a seventh metal layer provided on the fourth metal layer and primarily composed of gold, silver, or platinum or their alloy.

11. The semiconductor device according to claim 10, wherein the seventh metal layer consists of gold, silver, or platinum.

12. The semiconductor device according to claim 1, wherein the second metal layer consists of aluminum, the third metal layer consists of molybdenum or titanium, and the fourth metal layer consists of nickel, iron or cobalt.

13. The semiconductor device according to claim 12, wherein the first metal layer consists of vanadium or titanium.

* * * * *